United States Patent
Brannstrom et al.

(10) Patent No.: US 8,091,012 B2
(45) Date of Patent: Jan. 3, 2012

(54) SYSTEM AND METHOD FOR DECREASING DECODER COMPLEXITY

(75) Inventors: Fredrik Brannstrom, Moutain View, CA (US); Andrea Goldsmith, Menlo Park, CA (US)

(73) Assignee: Quantenna Communications Inc., Sunnyvale, CA (US)

(*) Notice: Subject to any disclaimer, the term of this patent is extended or adjusted under 35 U.S.C. 154(b) by 1076 days.

(21) Appl. No.: 11/800,378

(22) Filed: May 4, 2007

(65) Prior Publication Data

US 2007/0283230 A1    Dec. 6, 2007

Related U.S. Application Data

(60) Provisional application No. 60/797,956, filed on May 4, 2006.

(51) Int. Cl.
*H03M 13/03* (2006.01)

(52) U.S. Cl. .................. 714/786; 714/790; 714/758

(58) Field of Classification Search .............. 714/786, 714/790, 758, 776, 777, 792, 795, 791; 341/90
See application file for complete search history.

(56) References Cited

U.S. PATENT DOCUMENTS

| | | | |
|---|---|---|---|
| 5,268,695 A | 12/1993 | Dentinger et al. | |
| 5,729,558 A | 3/1998 | Mobin | |
| 6,035,007 A * | 3/2000 | Khayrallah et al. | 375/341 |
| 6,081,700 A | 6/2000 | Salvi et al. | |
| 6,470,047 B1 | 10/2002 | Kleinerman et al. | |
| 6,477,208 B1 | 11/2002 | Huff | |
| 6,477,213 B1 | 11/2002 | Miyoshi et al. | |
| 6,484,285 B1 * | 11/2002 | Dent | 714/791 |
| 6,642,904 B2 | 11/2003 | Yokoshima et al. | |
| 6,807,404 B2 | 10/2004 | Meijer | |
| 6,871,052 B2 | 3/2005 | Spencer et al. | |
| 6,967,598 B2 * | 11/2005 | Mills | 341/50 |
| 7,035,343 B2 | 4/2006 | Chi et al. | |
| 7,058,422 B2 | 6/2006 | Learned et al. | |
| 7,076,263 B2 | 7/2006 | Medvedev et al. | |
| 7,194,237 B2 | 3/2007 | Sugar et al. | |
| 7,224,743 B2 * | 5/2007 | Holmes et al. | 375/265 |
| 7,298,798 B1 | 11/2007 | Chao et al. | |
| 7,321,636 B2 | 1/2008 | Harel et al. | |
| 7,400,872 B2 | 7/2008 | Kogure | |
| 7,415,079 B2 * | 8/2008 | Cameron et al. | 375/340 |
| 7,450,657 B2 | 11/2008 | Paulraj et al. | |
| 7,533,327 B2 * | 5/2009 | Heiman et al. | 714/781 |
| 7,564,931 B2 | 7/2009 | Venkataramani et al. | |
| 7,623,836 B1 | 11/2009 | Finkelstein | |
| 2002/0163879 A1 | 11/2002 | Li et al. | |

(Continued)

FOREIGN PATENT DOCUMENTS

WO    WO-2007021159    2/2007

(Continued)

OTHER PUBLICATIONS

Ratfai et al., *IEEE Custom Integrated Circuit Conference*, P-41-1:357-361 (2005).

(Continued)

*Primary Examiner* — Fritz Alphonse (57) ABSTRACT

A device including a minimal trellis decoder is disclosed. The device can receive an encoded codeword, which the minimal trellis decoder efficiently decodes. In a specific implementation, the device can include a Bluetooth receiver that, in operation, receives an encoded codeword from a Bluetooth transmitter, which is decoded by the minimal trellis decoder.

20 Claims, 7 Drawing Sheets

U.S. PATENT DOCUMENTS

| | | | |
|---|---|---|---|
| 2003/0003863 | A1 | 1/2003 | Thielecke et al. |
| 2003/0081701 | A1 | 5/2003 | Pick et al. |
| 2003/0087673 | A1 | 5/2003 | Walton et al. |
| 2003/0141938 | A1 | 7/2003 | Poklemba et al. |
| 2003/0157954 | A1 | 8/2003 | Medvedev et al. |
| 2003/0185309 | A1 | 10/2003 | Pautler et al. |
| 2004/0013209 | A1 | 1/2004 | Zehavi et al. |
| 2004/0153679 | A1 | 8/2004 | Fitton et al. |
| 2004/0234012 | A1 | 11/2004 | Rooyen |
| 2004/0240486 | A1 | 12/2004 | Venkatesh et al. |
| 2005/0053172 | A1 | 3/2005 | Heikkila |
| 2005/0085269 | A1 | 4/2005 | Buljore et al. |
| 2005/0099937 | A1 | 5/2005 | Oh et al. |
| 2005/0113041 | A1 | 5/2005 | Polley et al. |
| 2005/0130694 | A1 | 6/2005 | Medvedev et al. |
| 2005/0170839 | A1 | 8/2005 | Rinne et al. |
| 2005/0192019 | A1 | 9/2005 | Kim et al. |
| 2005/0195784 | A1 | 9/2005 | Freedman et al. |
| 2005/0220057 | A1 | 10/2005 | Monsen |
| 2005/0245201 | A1 | 11/2005 | Ella et al. |
| 2005/0265470 | A1 | 12/2005 | Kishigami et al. |
| 2005/0276361 | A1 | 12/2005 | Kim et al. |
| 2006/0034217 | A1 | 2/2006 | Kwon et al. |
| 2006/0034221 | A1 | 2/2006 | Karaoguz et al. |
| 2006/0083290 | A1 | 4/2006 | Shin et al. |
| 2006/0094385 | A1 | 5/2006 | Rafati |
| 2006/0223487 | A1 | 10/2006 | Alam et al. |
| 2006/0270427 | A1 | 11/2006 | Shida et al. |
| 2006/0276227 | A1 | 12/2006 | Dravida |
| 2007/0136446 | A1 | 6/2007 | Rezvani et al. |
| 2007/0153924 | A1 | 7/2007 | Ling et al. |
| 2007/0202818 | A1 | 8/2007 | Okamoto |
| 2007/0230638 | A1 | 10/2007 | Griniasty |
| 2007/0258534 | A1 | 11/2007 | Schmidt |
| 2008/0139123 | A1* | 6/2008 | Lee et al. ............... 455/63.1 |
| 2008/0159123 | A1 | 7/2008 | Tehrani et al. |
| 2010/0091891 | A1 | 4/2010 | Calando et al. |

FOREIGN PATENT DOCUMENTS

| | | |
|---|---|---|
| WO | WO-2007130578 | 11/2007 |

OTHER PUBLICATIONS

Ratfai et al., *IEEE Journal of Solid State Circuits*, 42(6):1291-1299 (2007).

Co-pending U.S. Appl. No. 11/653,135, filed Jan. 11, 2007.

Final Office Action Mailed May 11, 2010 in Co-pending U.S. Appl. No. 11/653,135, filed Jan. 11, 2007.

Non-Final Office Action Mailed Dec. 31, 2009 in Co-pending U.S. Appl. No. 11/653,135, filed Jan. 11, 2007.

Non-Final Office Action Mailed Jun. 8, 2009 in Co-pending U.S. Appl. No. 11/653,135, filed Jan. 11, 2007.

Co-pending U.S. Appl. No. 12/299,470, filed Mar. 19, 2009.

Co-pending U.S. Appl. No. 11/872,700, filed Oct. 15, 2007.

Co-pending U.S. Appl. No. 12/288,569, filed Oct. 20, 2008.

Co-pending U.S. Appl. No. 11/800,357, filed May 4, 2007.

Non-Final Office Action Mailed May 4, 2010 in Co-pending U.S. Appl. No. 11/800,357, filed May 4, 2007.

Giallorenzi et al., "Noncoherent Sequence Demodulation for Trellis Coded M-DPSK", Military Communications Conference, 1991, MILCOM '91, Conference Record, Military Communication in a Changing World, IEEE, vol. 3, Nov. 1991, pp. 1023-1027.

Kong et al., "Detection of Amplitude-Phase Modulated Signals Over Frequency Nonselective Rayleigh Fading Channels with Adaptive Symbol-Aided Channel Estimation", 1996, Vehicular Technology Conference, 1996, Mobile Technology for the Human Race, IEEE 46th, vol. 2, pp. 983-987.

International Search Report of PCT/US07/10845 dated Jul. 28, 2008, pp. 1-3.

Written Opinion of PCT/US07/10845 dated Jul. 28, 2008, pp. 1-7.

International Search Report of PCT/US2008/011965 dated Mar. 25, 2009, pp. 1-3.

Written Opinion of PCT/US2008/011965 dated Mar. 25, 2009, pp. 1-6.

Non-Final Office Action Mailed Aug. 5, 2010, in Co-Pending U.S. Appl. No. 11/872,700, filed Oct. 15, 2007.

Action mailed May 4, 2011 from U.S. Appl. No. 11/653,135 filed Jan. 11, 2007.

Office Action mailed Jan. 26, 2011 from U.S. Appl. No. 12/299,470 filed Mar. 19, 2009.

Office Action mailed Feb. 15, 2011 from U.S. Appl. No. 11/872,700 filed Oct. 15, 2007.

Notice of Allowance mailed May 23, 2011 from U.S. Appl. No. 11/872,700 filed Oct. 15, 2007.

Office Action mailed Dec. 22, 2010 from U.S. Appl. No. 11/800,357 filed May 4, 2007.

Notice of Allowance dated May 12, 2011 from U.S. Appl. No. 11/800,357 filed May 4, 2007.

* cited by examiner

SYSTEM AND METHOD FOR DECREASING DECODER COMPLEXITY

CROSS REFERENCE TO RELATED APPLICATIONS

This application claims priority to U.S. Provisional Application 60/797,956, entitled Multimedia Cell Platform, filed May 4, 2006, which is incorporated by reference.

BACKGROUND

In digital communication, transmission of information sometimes produces error. Techniques of reducing and monitoring error have been developed. Error can be monitored and sometimes corrected. One area that has developed has centered around Hamming codes, and particularly shortened Hamming codes.

Hamming codes introduce redundancy in data by adding information to existing data to identify and correct error following transmission of the data. For example, appending an error correction code to a unit of data and transmitting the resulting codeword can allow for higher tolerance to noise and error.

Typically, a transmitter encodes a data unit to produce what is sometimes referred to as a "codeword." The transmitter then sends the codeword to a receiver. Typically, a receiver decodes the codeword to obtain the original data unit and the error correction code. A decoder in the receiver may include a trellis representation of a Hamming code. A trellis representation is a view of a convolutional or block code explained using a trellis diagram.

In drawing a trellis, sets of states are used to represent all possible points which can be assumed at successive stages by a state machine, which is used to encode source data. Before sending, data is encoded into a codeword from a limited number of possible codewords including error correction data. Only a specific set of codewords is permitted for transmission. Upon receipt, a receiver implementing a trellis decoder decodes the codewords and provides the data to a communications system.

Once a codeword has been properly received, a trellis search algorithm, such as the Viterbi algorithm or the Bahl, Cocke, Jelinek, Raviv (BCJR) algorithm, can be used to decode the codeword. Notably, there is a large number of computational steps required to perform Viterbi or other trellis decoding. The complexity of a decoder based on the Viterbi or other trellis search algorithms may increase in complexity based on the size of the trellis structure corresponding to the decoder. The number of computational steps required to perform Viterbi or other trellis search decoding is related to the size of the trellis structure used to implement the decoder.

SUMMARY

The following embodiments and aspects thereof are described and illustrated in conjunction with systems, tools, and methods that are meant to be exemplary and illustrative, not limiting in scope. In various embodiments, one or more of the above-described problems have been reduced or eliminated, while other embodiments are directed to other improvements. Advantageously, this technique can decrease complexity while reducing power consumption. It may even facilitate a reduction in die size.

The proposed decoding technique applies to any system that uses a shortened Hamming (15, 10) block code. This code is used, for example, in Bluetooth radios, where reduced decoding complexity is extremely important due to the need for low power.

BRIEF DESCRIPTION OF THE DRAWINGS

Embodiments of the inventions are illustrated in the figures. However, the embodiments and figures are illustrative rather than limiting; they provide examples of the inventions.

DETAILED DESCRIPTION OF THE INVENTION

In the following description, several specific details are presented to provide a thorough understanding of embodiments of the invention. One skilled in the relevant art will recognize, however, that the invention can be practiced without one or more of the specific details, or in combination with other components, etc. In other instances, well-known implementations or operations are not shown or described in detail to avoid obscuring aspects of various embodiments of the invention.

Figure 1:
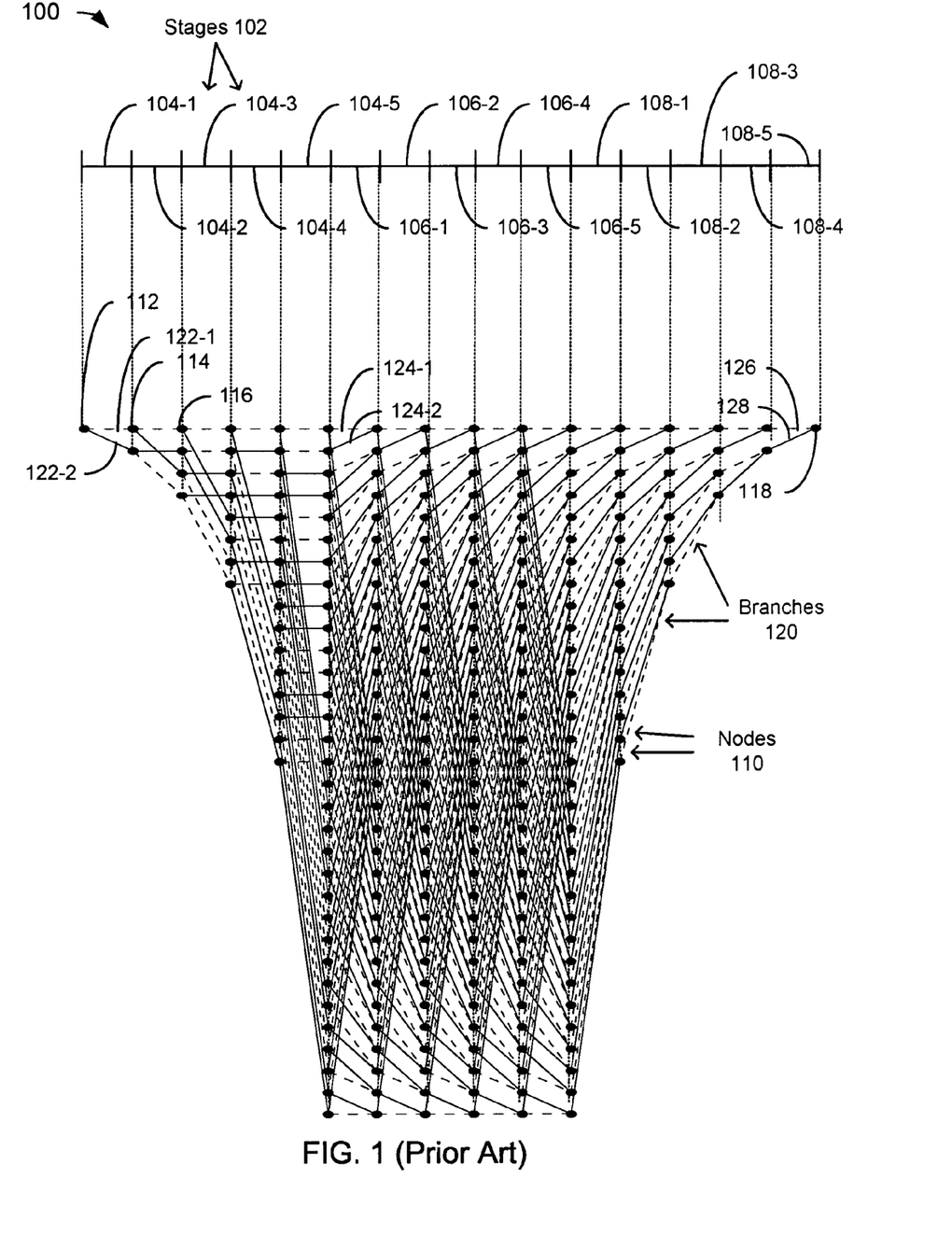
FIG. 1 depicts a prior art traditional trellis representation for a shortened Hamming (15, 10) code.

FIG. 1 depicts a prior art example of a traditional trellis representation 100, which is viewed for illustrative purposes as a convolutional code for a shortened (15, 10) Hamming code. The traditional trellis representation 100 includes a plurality of stages 102 (in the example of FIG. 1, there are 15 stages). The stages 102 may be categorized based upon their position in the trellis. In the example of FIG. 1, the first five of the states 102 may be referred to as initial stages 104-1 to 104-5 (referred to collectively as initial stages 104), the second five of the stages 102 may be referred to as intermediate stages 106-1 to 106-5 (referred to collectively as intermediate stages 106), and the third five of the stages 102 may be referred to as final stages 108-1 to 108-5 (referred to collectively as final stages 108).

In the example of FIG. 1, the traditional trellis representation 100 includes nodes 110 that are associated with states of the traditional trellis representation 100. The first of the nodes 110 may be referred to as an initial node 112 (which may be referred to as an initial node set, where the set includes a single node), the second node set of the nodes 110 may be referred to as one-hop nodes 114 because there is one branch from the initial node to the one-hop nodes, the third set of the nodes 110 may be referred to as two-hop nodes 116, and so forth to the final node 118 (which may be referred to as a final node set, where the set includes a single node). In the example of FIG. 1, the initial node 112 may be referred to in the alternative as a zero-hop node because zero hops are needed in the traditional trellis representation 100 to reach the initial node 112; and the final node 118 may be referred to in the alternative as a 15-hope node because there are 15 stages in the traditional trellis representation 100.

It may be noted that the initial node 112 need not be treated as part of the initial stages 104 nodes (at least in part because it does not have one input branch like the one-hop to five-hop node sets). For similar reasons (i.e., the 10-hop nodes have different characteristics from the six- to nine-hop nodes), the 10-hop nodes may be treated as part of the final stages 108 nodes, rather than the intermediate stages 106 nodes, though at times it will be convenient to refer to the 10-hop nodes as part of the intermediate stages 106 nodes. For similar reasons (i.e., the final node 118 has no output branches), the final node 118 need not be treated as part of the final stages 108.

In the example of FIG. 1, the nodes 110 are coupled via branches 120. Initial stages 104 nodes include two initial stage output branches 122-1 and 122-2 (referred to collectively as the initial stage output branches 122). Initial stages 104 nodes have a single input branch (except for the initial node 112). Since each node of the initial stages has one input and two outputs, each successive stage of the traditional trellis representation 100 has twice as many nodes as the last, or, more generally, $2^i$ nodes, where i is the number of hops to get to the stage. Thus, after initial stage 104-5, there are 32 nodes in the five-hop node set.

In the example of FIG. 1, the intermediate stages 106 nodes include two intermediate stage output branches 124-1 and 124-2 (referred to collectively as the intermediate stage output branches 124). Intermediate stages 106 nodes also have two input branches. Since each node of the intermediate stages has two inputs and two outputs, each successive intermediate stage of the traditional trellis representation 100 has the same number of stages as the previous stage.

In the example of FIG. 1, the final stages 108 nodes include one final stage output branch 126. Final stages 108 nodes also have two input branches. Since there are fewer output branches than input branches, a final stage output branch 128 is provided as input to a same node as the final stage output branch 126, and each successive final stage of the traditional trellis representation 100 has fewer stages than the previous stage. In general, there are $2^{n-i}$ nodes, where n is the total number of stages and i is the number of hops to get to the stage. Thus, after final stage 108-5, which is a $15^{th}$-hop stage, there is one node (i.e., the final node 118) in the final node set.

As should be apparent from the example of FIG. 1, complexity of the traditional trellis representation 100 is determined by the number of branches and states in the trellis. In general, the greater the number of states and branches, the greater the complexity of a corresponding decoder.

As a rule, in the traditional trellis representation 100, a set of i-hop nodes is an initial stage set of nodes if the set of i+1-hop nodes is a larger set; the set of i-hop nodes is an intermediate stage set of nodes if a set of i+1-hop nodes is an equal set; the set of i-hop nodes is a final stage set of nodes if a set of i+1-hop nodes is a smaller set. In general, such a rule cannot be rigidly applied to a minimal trellis representation, such as depicted later by way of example but not limitation in FIG. 2.

An (N, K) block code with codewords of length N for K information bits can be represented as a punctured convolutional code and decoded using a time-invariant trellis with N sections and $2^{N-K}$ states. The shortened Hamming (15, 10) code used in Bluetooth is a systematic code, so the first K=10 bits of a codeword are the information bits, and the remaining N−K=5 bits of a codeword are parity bits generated by modulo-2 addition of different combinations of the information bits. The codebook C has $2^{10}$=1024 codewords. The generator polynomial for the shortened Hamming code (15, 10) is $$g(D)=(D+1)(D^4+D+1)=D^5+D^4+D^2+1.$$

The generator matrix can be found from the generator polynomial $$G = \begin{bmatrix} 1 & 0 & 0 & 0 & 0 & 0 & 0 & 0 & 0 & 0 & 1 & 1 & 0 & 1 & 0 \\ 0 & 1 & 0 & 0 & 0 & 0 & 0 & 0 & 0 & 0 & 0 & 1 & 1 & 0 & 1 \\ 0 & 0 & 1 & 0 & 0 & 0 & 0 & 0 & 0 & 0 & 1 & 1 & 1 & 0 & 0 \\ 0 & 0 & 0 & 1 & 0 & 0 & 0 & 0 & 0 & 0 & 0 & 1 & 1 & 1 & 0 \\ 0 & 0 & 0 & 0 & 1 & 0 & 0 & 0 & 0 & 0 & 0 & 0 & 1 & 1 & 1 \\ 0 & 0 & 0 & 0 & 0 & 1 & 0 & 0 & 0 & 0 & 1 & 1 & 0 & 0 & 1 \\ 0 & 0 & 0 & 0 & 0 & 0 & 1 & 0 & 0 & 0 & 1 & 0 & 1 & 1 & 0 \\ 0 & 0 & 0 & 0 & 0 & 0 & 0 & 1 & 0 & 0 & 0 & 1 & 0 & 1 & 1 \\ 0 & 0 & 0 & 0 & 0 & 0 & 0 & 0 & 1 & 0 & 1 & 1 & 1 & 1 & 1 \\ 0 & 0 & 0 & 0 & 0 & 0 & 0 & 0 & 0 & 1 & 1 & 0 & 1 & 0 & 1 \end{bmatrix}.$$

This code has a minimum Hamming distance of 4.

The trellis for the shortened Hamming (15, 10) code viewed as a convolutional code has 32 states per section (disregarding the initial and the termination sections) and its typical representation is shown in FIG. 1. In the example of FIG. 1, the black dots are trellis states, also referred to as nodes herein, the dashed line branches are for output bit 0, and the solid line branches are for output bit 1. For a (15,10) systematic code, the first 10 output bits of the codeword (over Stages 1-10) correspond to the 10 input bits, and the last 5 output bits of the codeword (over Stages 11-15) are the parity bits. There are 1024 paths through the trellis, corresponding to the 1024 codewords in the codebook C, and it is easy to map a trellis path to a codeword based on the branch line style (e.g., solid or dashed). The codeword in turn is easy to map to the information bits since it is systematic (hence the first 10 bits of the codeword are the information bits).

Viterbi decoding can be implemented based on a trellis representation for a code by eliminating codewords associated with all paths into each trellis state except the path with the maximum likelihood metric. The complexity of the decoder can be measured in the number of solid line branches (which correspond to additions in computing the metric) and the number of states that have two entering branches (which correspond to comparisons to decide which has the larger metric). The trellis in FIG. 1 has a maximum of 32 states per section, 253 total states, and 444 total branches, as summarized in Table 1. The number of additions is half the number of branches. The number of additions and the number of comparisons are also summarized as the two last rows in Table 1, assuming that the search starts from the end of the trellis.

TABLE 1

| Decoder complexity for trellis of FIG. 1. | | | | | | | | | | | | | | | | |
|---|---|---|---|---|---|---|---|---|---|---|---|---|---|---|---|---|
| Section | 1 | 2 | 3 | 4 | 5 | 6 | 7 | 8 | 9 | 10 | 11 | 12 | 13 | 14 | 15 | Tot. |
| # States | 1 | 2 | 4 | 8 | 16 | 32 | 32 | 32 | 32 | 32 | 32 | 16 | 8 | 4 | 2 | 253 |
| # Branches | 2 | 4 | 8 | 16 | 32 | 64 | 64 | 64 | 64 | 64 | 32 | 16 | 8 | 4 | 2 | 444 |

TABLE 1-continued

Decoder complexity for trellis of FIG. 1.

| Section | 1 | 2 | 3 | 4 | 5 | 6 | 7 | 8 | 9 | 10 | 11 | 12 | 13 | 14 | 15 | Tot. |
|---|---|---|---|---|---|---|---|---|---|---|---|---|---|---|---|---|
| # Adds. | 1 | 2 | 4 | 8 | 16 | 32 | 32 | 32 | 32 | 32 | 16 | 8 | 4 | 2 | 1 | 222 |
| # Comp. | 1 | 2 | 4 | 8 | 16 | 32 | 32 | 32 | 32 | 32 | 0 | 0 | 0 | 0 | 0 | 191 |

The traditional trellis representation shown in FIG. 1 for the shortened Hamming (15, 10) code is straightforward to obtain for any linear code as it follows directly from sequential operations on the information bits. However, there may be other trellis representations for a given code. In particular, a minimal trellis representation of a code is a representation with no redundant trellis states. It is known that such a minimal trellis representation exists for all linear codes.

Figure 2:
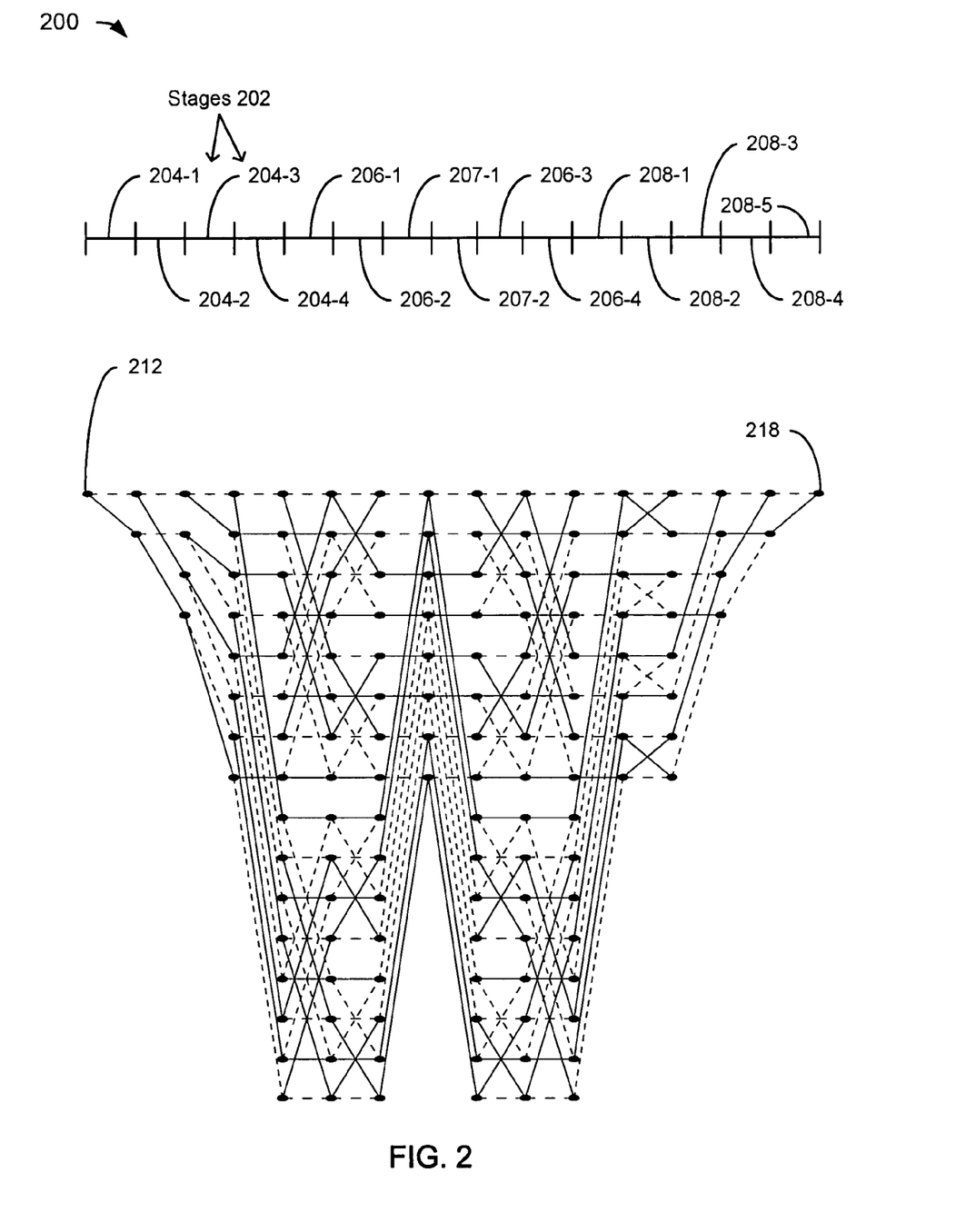
FIG. 2 depicts an example of a minimal trellis representation of a shortened (15, 10) Hamming code.

FIG. 2 depicts an example of a minimal trellis representation 200 of a shortened Hamming (15, 10) code. The minimal trellis representation includes a plurality of stages 202 (in the example of FIG. 2, there are 15 stages). The stages 202 may be categorized based upon their position in the trellis. In the example of FIG. 2, the first four of the states 202 may be referred to as initial stages 204-1 to 204-4 (referred to collectively as initial stages 204); the $5^{th}$, $6^{th}$, $9^{th}$, and $10^{th}$ of the stages 202 may be referred to as intermediate stages 206-1 to 206-4 (referred to collectively as intermediate stages 206); the $7^{th}$ and $8^{th}$ of the stages 202 may be respectively referred to as pre-median stage 207-1 and post-median stage 207-2 (referred to collectively as median stages 207); the $11^{th}$, $13^{th}$, $14^{th}$, and $15^{th}$ of the stages 202 may be referred to as final stages 208-1 to 208-4 (referred to collectively as the final stages 208); the 12th of the stages 202 may be referred to as a staggered final stage 209. In some cases, it may be convenient to refer to the median stages 207 as one of the "intermediate stages" and the staggered final stage 209 as one of the "final stages."

In an illustrative embodiment, the number of initial stages is reduced by one. This is associated with a corresponding decrease in the size of the largest node sets to 16, rather than 32 as would be the case for a traditional trellis. The number of intermediate stages (assuming median stages are included) is increased by one.

The complexity of the minimal trellis representation 200 is associated with the number of branches and states in the trellis. Although the complexity is reduced in the minimal trellis relative to a traditional trellis (thereby tending to reduce the complexity of a corresponding decoder), the behavior at various nodes is more variable. For example, the intermediate nodes include median nodes, as previously mentioned, and the final nodes include staggered final stage nodes, which have a different number of branches into and/or out of the node than, respectively, the other intermediate or final nodes.

As in FIG. 1, in the example of FIG. 2, the outputs may be associated with a line style. Dashed line branches are for output bit 0, solid line branches are for output bit 1, and black dots represent the different trellis states. As with the traditional trellis, there are 1024 paths through the minimal trellis, each corresponding to a codeword in the codebook C*. The mapping of minimal trellis paths to codewords is also straightforward based on the branch line style. The codebooks C and C* both correspond to matrices with 1024 rows (corresponding to the number of codewords) and 15 columns (corresponding to the number of bits in each codeword). There exists a unique permutation of the columns of C that results in the minimal trellis codebook C*. Finding this permutation through an exhaustive search is computationally very complex since it entails checking all permutations to determine which results in the correct mapping between C and C*. Because of the complexity and the lack of other methods for determining the permutation associated with the minimal trellis, this permutation is unknown for most classes of codes, including most Hamming codes and shortened Hamming codes.

Figure 6:
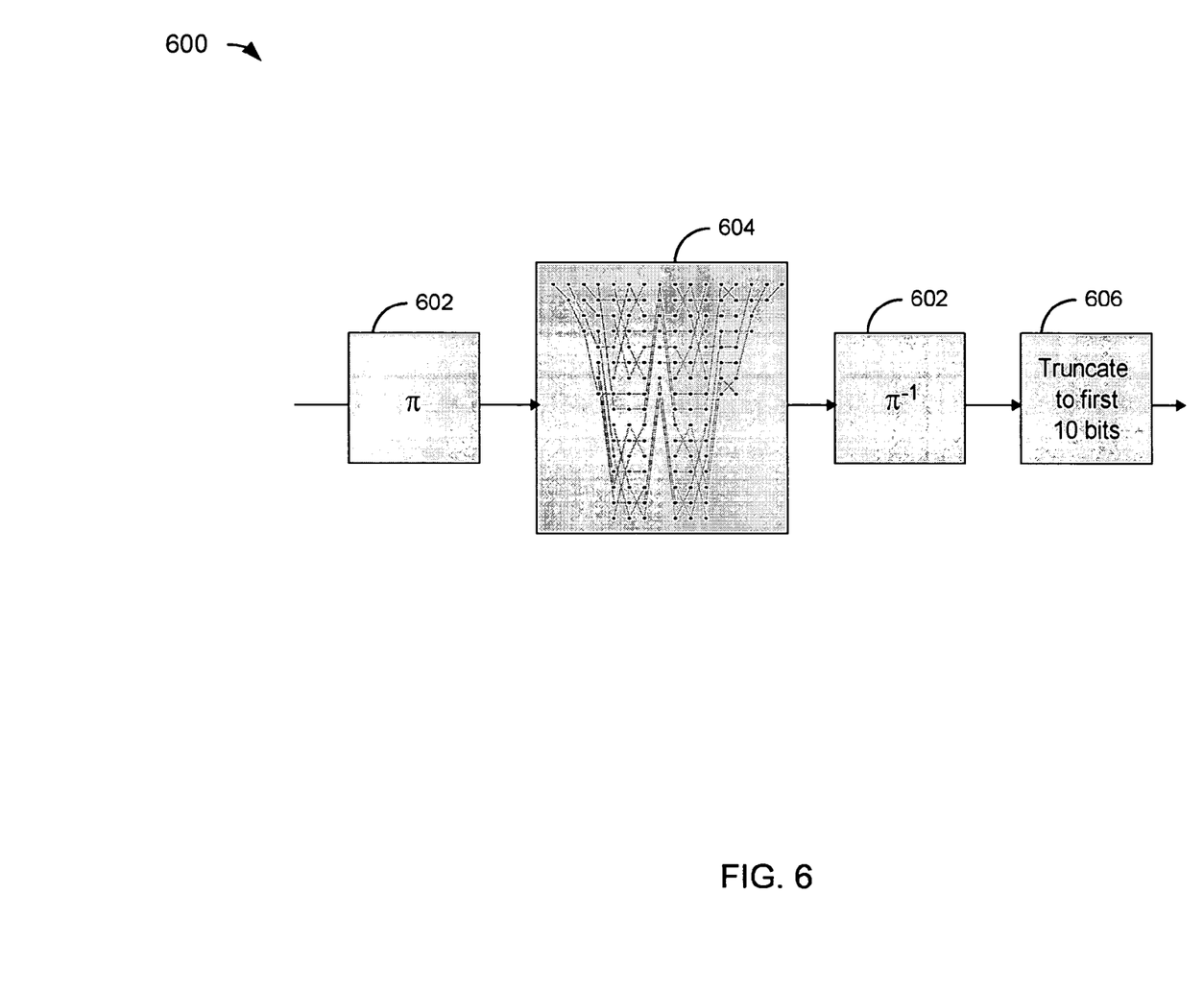
FIG. 6 depicts a decoder including a mapping engine and a minimal trellis implemented in a computer readable medium.

For the shortened Hamming (15, 10) code, we have found the permutation $\pi$ that maps the codebook C to C* or, equivalently, maps the order of codeword bits in C to the order of the codeword bits in C*. This permutation of the 15 codeword bits $r=[r_1,r_2,r_3,r_4,r_5,r_6,r_7,r_8,r_9,r_{10},r_{11},r_{12},r_{13},r_{14},r_{15}]$ corresponding to the minimal trellis is given by $r_\pi=\pi(r)=[r_1,r_7,r_9, r_3,r_{10},r_6,r_{11},r_4,r_5,r_8,r_{14},r_{15},r_{12},r_{13},r_2]$, The permutation is used to significantly decrease the complexity of the optimal decoder. Specifically, soft or hard decoding of the shortened Hamming (15,10) code can be performed by first permuting the received matched filter outputs $s \approx r$ according to the permutation $\pi$, where s is the received codeword corresponding to the transmitted codeword r, and can be based on either hard or soft decisions of the matched filter output. Next the resulting vector $s_\pi = \pi(s)$ is fed to the Viterbi (or other trellis search) decoder (operating on soft or hard inputs) corresponding to the minimal trellis in FIG. 2 to obtain an estimate $\hat{r}_\pi$ of the codeword corresponding to $s_\pi$. Finally, the inverse permutation $\pi^{-1}$ is applied to the estimated codeword $\hat{r}_\pi$ to obtain the estimate of the received codeword $\hat{r}=\pi^{-1}(\hat{r}_\pi)$. Since this is a systematic code, the first 10 bits of $\hat{r}$ correspond to the estimate of the 10 information bits in the received codeword s. The algorithm of this decoding process for each transmitted codeword is shown in FIG. 6.

The number of additions and comparisons using the minimal trellis operating on the permutation $s_\pi$ is reported in the two last rows of Table 2. The decoders based on the full trellis and the decoder based on the minimal trellis may or may not have identical performance. By comparing Table 1 and Table 2 it is clear that the decoder based on the minimal trellis has 47% fewer additions and 50% fewer comparisons.

TABLE 2

Decoder complexity for the minimal trellis of FIG. 2

| Section | 1 | 2 | 3 | 4 | 5 | 6 | 7 | 8 | 9 | 10 | 11 | 12 | 13 | 14 | 15 | Tot. |
|---|---|---|---|---|---|---|---|---|---|---|---|---|---|---|---|---|
| # States | 1 | 2 | 4 | 8 | 16 | 16 | 16 | 8 | 16 | 16 | 16 | 8 | 8 | 4 | 2 | 141 |
| # Branches | 2 | 4 | 8 | 16 | 32 | 32 | 16 | 16 | 32 | 32 | 16 | 16 | 8 | 4 | 2 | 236 |
| # Adds. | 1 | 2 | 4 | 8 | 16 | 16 | 8 | 8 | 16 | 16 | 8 | 8 | 4 | 2 | 1 | 118 |
| # Comp. | 1 | 2 | 4 | 8 | 16 | 16 | 0 | 8 | 16 | 16 | 0 | 8 | 0 | 0 | 0 | 95 |

Figure 3A:
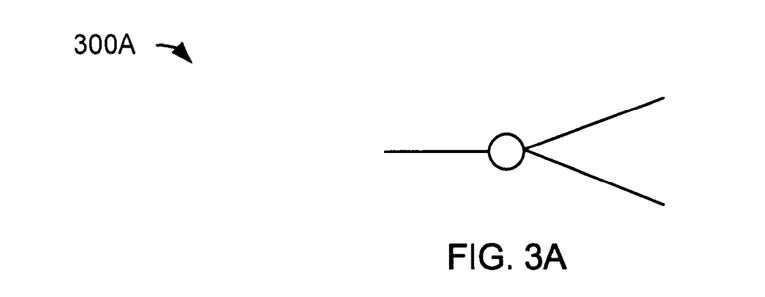
FIG. 3 depicts a diagram of an example of several states of a trellis having three different branching structures.

FIGS. 3A to 3C depict examples of nodes in a trellis representation. In the example of FIG. 3A, a node 300A has one input branch and two output branches. The node 300A could be incorporated into an initial stage node of the traditional trellis representation 100 (FIG. 1) or the minimal trellis representation 200 (FIG. 2). In addition, the node 300A could be incorporated into a median stage node of the minimal trellis representation 200.

Figure 3B:
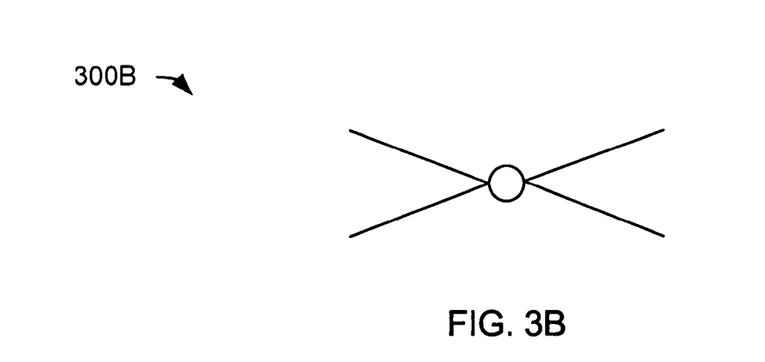

In the example of FIG. 3B, a node 300B has two input branches and two output branches. The node 300B could be incorporated into an intermediate stage node of the traditional trellis representation 100 or the minimal trellis representation 200. In addition, the node 300B could be incorporated into a staggered final stage node of the minimal trellis representation 200.

Figure 3C:
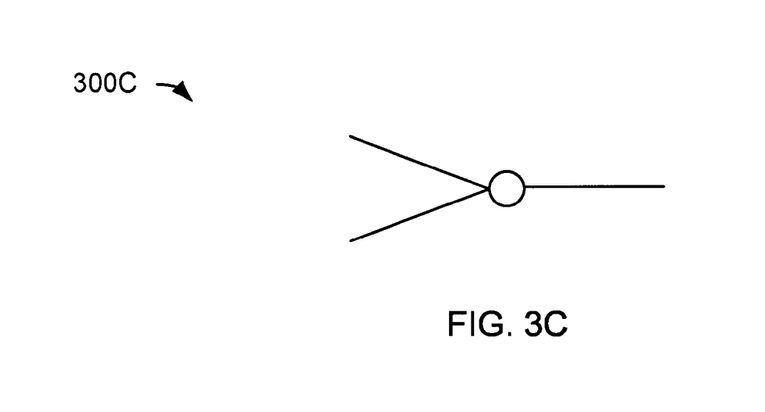

In the example of FIG. 3C, a node 300C has two input branches and one output branch. The node 300C could be incorporated into a final stage node of the traditional trellis representation 100 or the minimal trellis representation 200. In addition, the node 300C could be incorporated into a median stage node of the minimal trellis representation 200.

Figure 4:
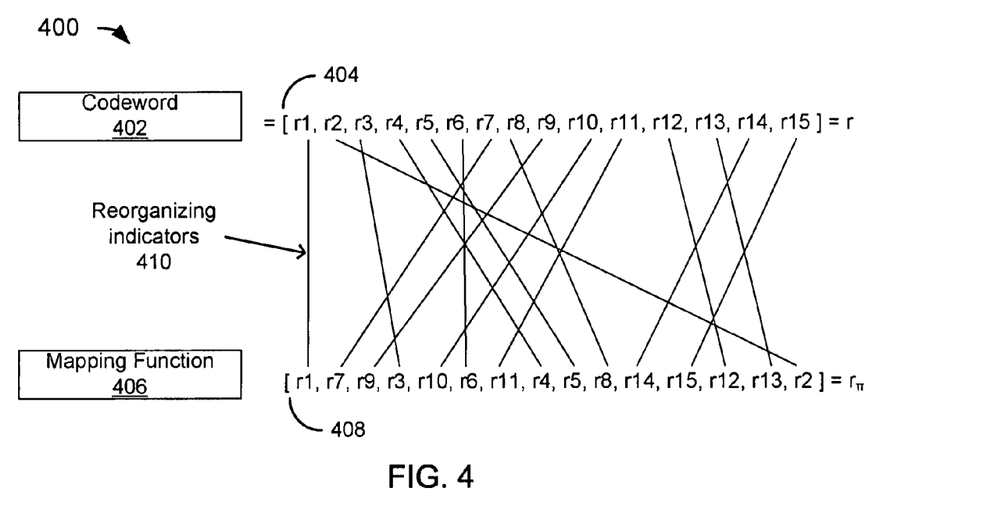
FIG. 4 depicts an example of a conceptual diagram illustrating reorganization of a codeword.

FIG. 4 depicts an example of a conceptual diagram 400 illustrating reorganization of a codeword. The diagram 400 includes a codeword 402, an array of bit positions 404 of the codeword 402, a mapping function 406, an array of mapped bit positions 408, and reorganizing indicators 410. In the example of FIG. 4, the codeword 402 has 15 associated bit positions, depicted in the array of bit positions 404 as r1 to r15. The mapping function 406 maps r to $r_\pi$ as indicated in the example using the reorganizing indicators 410. The mapping function may be represented as: $\pi(r)=\pi([r_1,r_2,r_3,r_4,r_5,r_6,r_7,r_8,r_9,r_{10},r_{11},r_{12},r_{13},r_{14},r_{15}])=[r_1,r_7,r_9,r_3,r_{10},r_6,r_{11},r_4,r_5,r_8,r_{14},r_{15},r_{12},r_{13},r_2]=r_\pi$.

In a non-limiting embodiment, the mapping function 406 may be implemented in a computer readable medium such that a mapping engine could reorganize bits of a codeword for decoding by a minimal trellis as depicted in the diagram 400. The mapping function corresponds to the minimal trellis, and reorganizes codewords received that could be decoded by a traditional trellis.

Figure 5:
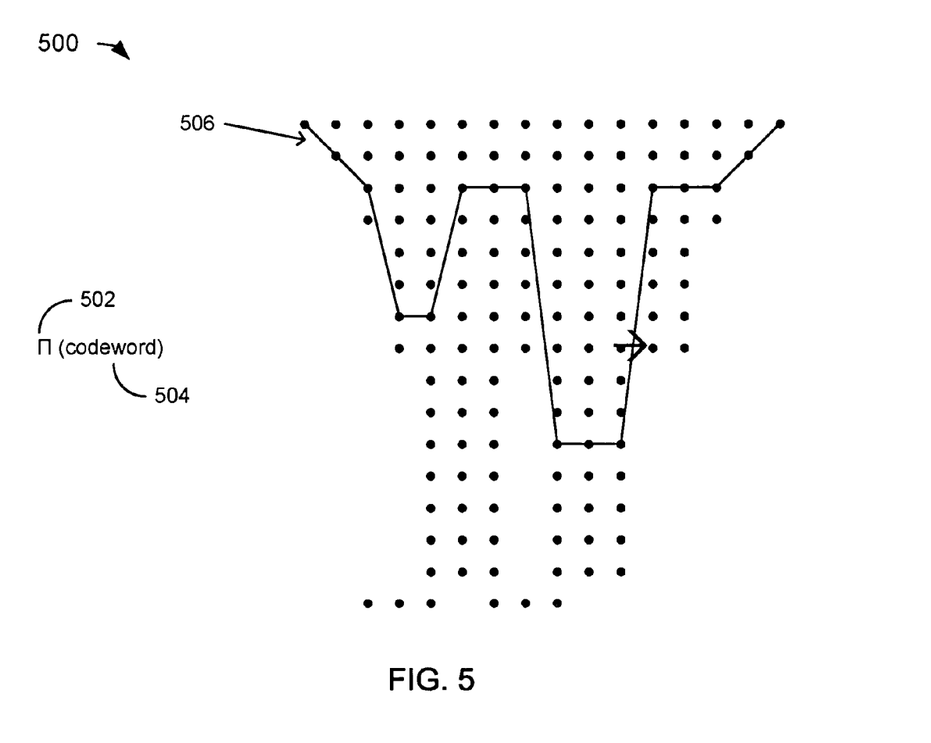
FIG. 5 depicts a graphical diagram of an example of an arbitrary path through the minimal trellis which might be selected by the Viterbi or other trellis search algorithm when decoding a codeword.

FIG. 5. depicts a graphical diagram 500 of an example of an arbitrary path through a minimal trellis which might be selected by a Viterbi or other trellis search algorithm when decoding a codeword. The diagram 500 includes mapping function 502, codeword 504, and path 506. In the example of FIG. 5, mapping function 502 reorganizes the codeword 504, and a maximum likelihood path can be traced through the minimal trellis.

FIG. 6 depicts a decoder 600 including a mapping engine and a minimal trellis implemented in a computer readable medium. The decoder 600 includes a mapping engine 602 and logic implementing a minimal trellis decoder 604. In the example of FIG. 6 the mapping engine 602 passes an encoded codeword through the logic implementing the minimal trellis search 604 to yield the codeword associated with the maximum likelihood path to which the inverse map $\pi^{-1}$ is applied to obtain a decoded codeword. It may be noted that the inverse map $\pi^{-1}$ is a part of the mapping engine 602 (i.e., the inverse representation of the function $\pi$ that is implemented in a computer-readable medium in the mapping engine 602). A truncator 606 truncates the codeword. Since the decoded codeword is from a shortened Hamming (15, 10) code, truncating the codeword to the first 10 bits yields the information bits associated with the codeword.

Figure 7:
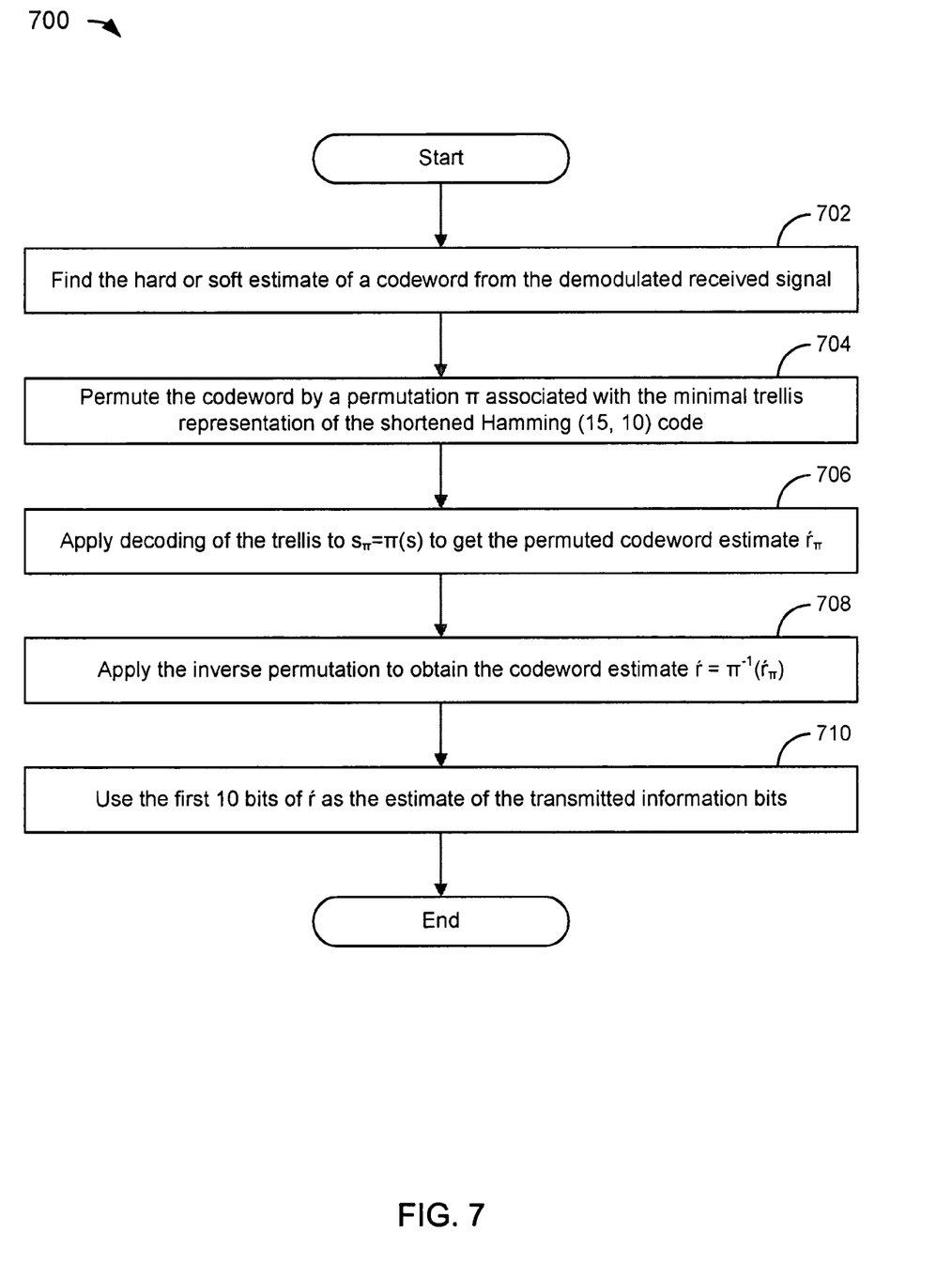
FIG. 7 depicts a flowchart of an example of a method for obtaining information bits from an encoded codeword.

FIG. 7 depicts a flowchart 700 of an example of a method for obtaining a information bits from an encoded codeword. In the example of FIG. 7, the flowchart 700 starts at module 702 where a hard or soft estimate of the codeword is found from the demodulated received signal. In the example of FIG. 7, the flowchart 700 continues to module 704 where the codeword is permuted by a permutation $\pi$ associated with the minimal trellis representation of a shortened Hamming (15, 10) code. In the example of FIG. 7, the flowchart 700 continues to module 706 where decoding of the minimal trellis is applied to $s_\pi=\pi(s)$, where s is the received codeword, to get the permuted codeword estimate $\hat{r}_\pi$. In the example of FIG. 7, the flowchart 700 continues to module 708 where the inverse permutation is applied to obtain the codeword estimate $\hat{r}=\pi^{-1}(\hat{r}_\pi)$. In the example of FIG. 7, the flowchart 700 ends at module 710 with using the first 10 bits of $\hat{r}$ as the estimate of the transmitted information bits.

Figure 8:
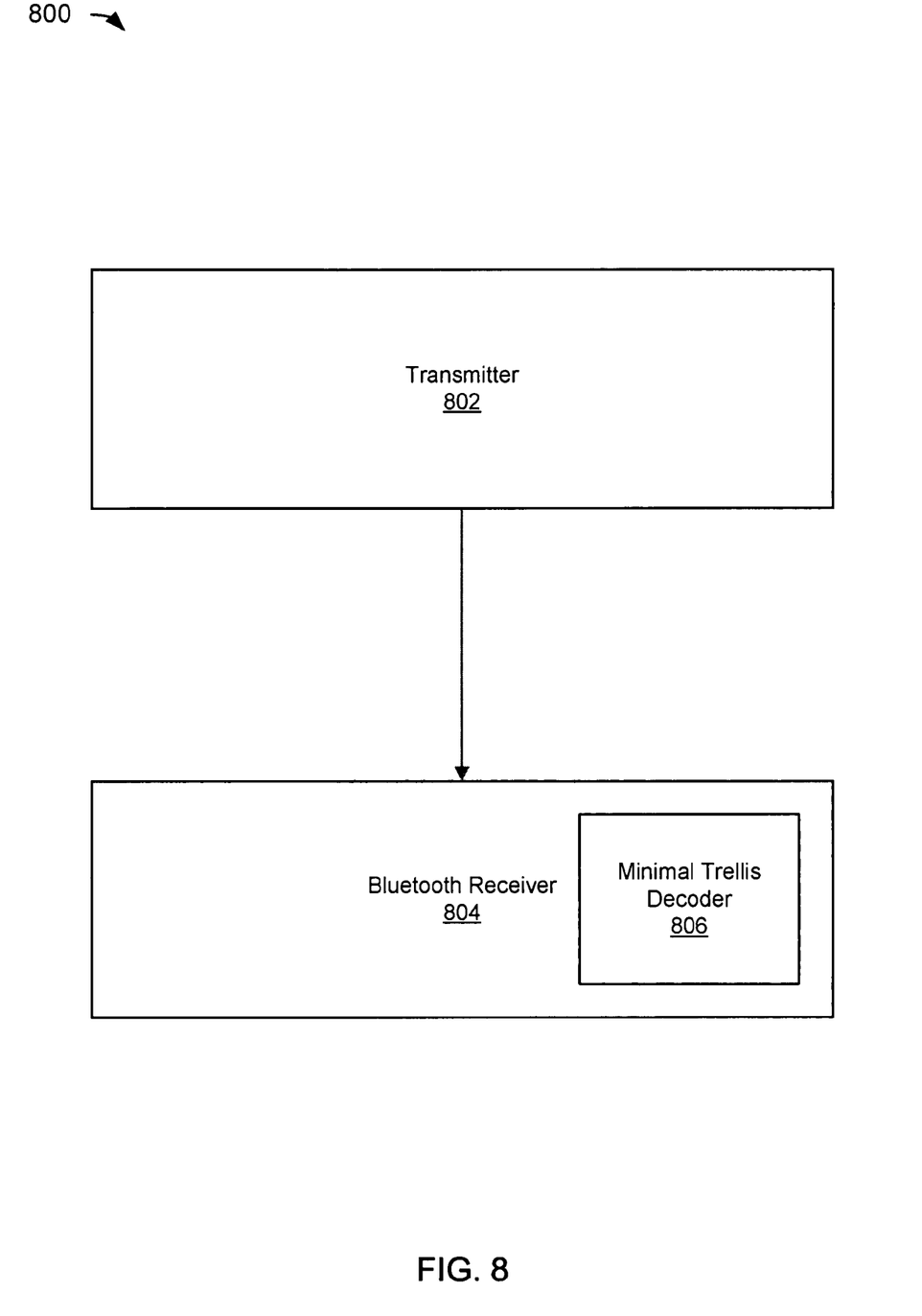
FIG. 8 depicts an example of a system including a Bluetooth receiver with a minimal trellis decoder.

FIG. 8 depicts an example of a system 800 including a Bluetooth receiver with a minimal trellis decoder. The system 800 includes a transmitter 802, a Bluetooth receiver 804, and a minimal trellis decoder 806 implemented on the Bluetooth receiver 804. These devices function in accordance with techniques described previously.

While this invention has been described in terms of certain embodiments, it will be appreciated by those skilled in the art that certain modifications, permutations and equivalents thereof are within the inventive scope of the present invention. It is therefore intended that the following appended claims include all such modifications, permutations and equivalents as fall within the true spirit and scope of the present invention; the invention is limited only by the claims.

We claim:

1. A system comprising:
   a Bluetooth transmitter;
   a Bluetooth receiver, wherein, in operation, the Bluetooth receiver receives an encoded codeword from the Bluetooth transmitter;
   a minimal trellis decoder, coupled to the Bluetooth receiver, for efficiently decoding the encoded codeword and removing parity bits to yield data bits associated with the codeword.

2. The system of claim 1, further comprising a minimal trellis, embodied in the minimal trellis decoder, including initial stages, intermediate stages, and final stages.

3. The system of claim 2, wherein the intermediate stages of the minimal trellis decoder include a median stage.

4. The system of claim 3 wherein a node of the median stage includes one input branch and two output branches or two input branches and one output branch.

5. The system of claim 2, wherein the final stages of the minimal trellis decoder include a staggered final stage.

6. The system of claim 5 wherein a node of the staggered final stage includes two input branches and two output branches.

7. The system of claim 2, further comprising a mapping engine configured to map bits of a codeword decodable using a traditional trellis to bits efficiently decodable using the minimal trellis.

8. A device comprising:
   a minimal trellis decoder, wherein a minimal trellis embodied in a computer readable medium on the decoder includes initial stages, intermediate stages, and final stages, and wherein the intermediate stages include a median stage and the final stages include a staggered final stage;
   a mapping engine stored in a computer readable medium, wherein, in operation, the mapping engine maps n bits of a codeword decodable using a traditional trellis to n bits efficiently decodable using the minimal trellis, and wherein the mapping engine includes a function $\pi([r_1,$ $r_2,r_3,r_4,r_5,r_6,r_7,r_8,r_9,r_{10},r_{11},r_{12},r_{13},r_{14},r_{15}])=[r_1,r_7,r_9,r_3, r_{10},r_6,r_{11},r_4,r_5,r_8,r_{14},r_{15},r_{12},r_{13},r_2]$, implemented in a computer-readable medium, wherein n=15, and the values of the arrays represent n bits of the codeword.

9. The device of claim 8 comprising: a computer readable medium containing an implementation of a Viterbi or other trellis search algorithm on the minimal trellis for the decoder to use in decoding the codeword.

10. The device of claim 8 further comprising a Bluetooth signal receiver coupled to the minimal trellis decoder.

11. The device of claim 8 wherein a node of the median stage includes one input branch and two output branches or two input branches and one output branch.

12. The device of claim 8 wherein a node of the staggered final stage includes two input branches and two output branches.

13. The device of claim 8 wherein the minimal trellis includes a minimal trellis expression of a shortened Hamming (15, 10) code.

14. The device of claim 8, wherein the codeword is a shortened Hamming code codeword.

15. A device comprising:
a minimal trellis decoder, wherein a minimal trellis embodied in a computer readable medium on the decoder includes initial stages, intermediate stages, and final stages, and wherein the intermediate stages include a median stage and the final stages include a staggered final stage;
a mapping engine stored in a computer readable medium, wherein, in operation, the mapping engine maps bits of a codeword decodable using a traditional trellis to bits efficiently decodable using the minimal trellis;
a Bluetooth signal receiver coupled to the minimal trellis decoder.

16. The device of claim 15 comprising: a computer readable medium containing an implementation of a Viterbi or other trellis search algorithm on the minimal trellis for the decoder to use in decoding the codeword.

17. The device of claim 15 wherein a node of the median stage includes one input branch and two output branches or two input branches and one output branch.

18. The device of claim 15 wherein a node of the staggered final stage includes two input branches and two output branches.

19. The device of claim 15 wherein the minimal trellis includes a minimal trellis expression of a shortened Hamming (15, 10) code.

20. The device of claim 15, wherein the codeword is a shortened Hamming code codeword.

* * * * *